United States Patent
Hashimoto

(10) Patent No.: US 7,514,350 B2
(45) Date of Patent: *Apr. 7, 2009

(54) ELECTRONIC DEVICE AND METHOD OF MANUFACTURING THE SAME, CIRCUIT BOARD, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 199 days.

This patent is subject to a terminal disclaimer.

(21) Appl. No.: 10/788,492

(22) Filed: Mar. 1, 2004

(65) Prior Publication Data

US 2004/0232540 A1  Nov. 25, 2004

(30) Foreign Application Priority Data

Mar. 13, 2003  (JP)  ............................. 2003-068282

(51) Int. Cl.
*H01L 29/04* (2006.01)
(52) U.S. Cl. .................. 438/611; 438/612; 257/676; 257/690; 257/735; 257/736; 257/E23.123
(58) Field of Classification Search .......... 438/610, 438/612, 614, 611; 257/735, 750, E23.01, 257/777, 690, 676, 736, E23.123, E23.126, 257/E23.014, E23.035, E23.061
See application file for complete search history.

(56) References Cited

U.S. PATENT DOCUMENTS

| | | | | |
|---|---|---|---|---|
| 5,550,408 A | * | 8/1996 | Kunitomo et al. | 257/737 |
| 6,445,069 B1 | * | 9/2002 | Ling et al. | 257/738 |
| 6,621,172 B2 | * | 9/2003 | Nakayama et al. | 257/787 |
| 6,625,032 B1 | * | 9/2003 | Ito et al. | 361/751 |
| 6,747,348 B2 | * | 6/2004 | Jeung et al. | 257/686 |
| 6,750,547 B2 | * | 6/2004 | Jeung et al. | 257/778 |
| 6,756,252 B2 | * | 6/2004 | Nakanishi | 438/118 |
| 6,825,564 B2 | * | 11/2004 | Gleason et al. | 257/762 |

FOREIGN PATENT DOCUMENTS

| | | |
|---|---|---|
| JP | A 1-164044 | 6/1989 |
| JP | A 8-130227 | 5/1996 |
| JP | A 9-51020 | 2/1997 |
| JP | A 2000-216330 | 8/2000 |

OTHER PUBLICATIONS

U.S. Appl. No. 10/788,447.*
U.S. Appl. No. 10/788,295.*
U.S. Appl. No. 10/788,449.*

* cited by examiner

Primary Examiner—Eugene Lee
(74) Attorney, Agent, or Firm—Oliff & Berridge, PLC

(57) ABSTRACT

An electronic device includes: a substrate on which an interconnect pattern is formed; a chip component having a first surface on which a pad is formed and a second surface opposite to the first surface, the chip component being mounted in such a manner that the second surface faces the substrate; a metal layer formed on the pad, the metal layer being less oxidizable than the pad; an insulating section formed of resin adjacent to the chip component; and an interconnect which is formed to extend from above the metal layer, over the insulating section and to above the interconnect pattern.

6 Claims, 7 Drawing Sheets

ELECTRONIC DEVICE AND METHOD OF MANUFACTURING THE SAME, CIRCUIT BOARD, AND ELECTRONIC INSTRUMENT

Japanese Patent Application No. 2003-68282, filed on Mar. 13, 2003, is hereby incorporated by reference in its entirety.

BACKGROUND OF THE INVENTION

The present invention relates to an electronic device and a Method of manufacturing the same, a circuit board, and also an electronic instrument.

With conventional chip-on-board (COB) mounting, the use of high temperatures require the substrate to have thermal resistivity, making it impossible to use a thermoplastic substrate. This makes it difficult to use an inexpensive substrate. In addition, since a semiconductor chip is subjected to external thermal or mechanical forces, it is difficult to avoid defects caused by the resultant stresses. When wire bonding is used, there are restrictions on the lengths of wires, so a general-purpose substrate cannot be used. Alternatively, if face-down bonding is used, it is necessary to use a special substrate that is matched to the layout of the electrodes of the semiconductor chip, so it is not possible to use a general-purpose substrate therefore.

BRIEF SUMMARY OF THE INVENTION

An electronic device according to one aspect of the present invention includes:

a substrate on which an interconnect pattern is formed;

a chip component having a first surface on which a pad is formed and a second surface opposite to the first surface, the chip component being mounted in such a manner that the second surface faces the substrate;

a metal layer formed on the pad, the metal layer being less oxidizable than the pad;

an insulating section formed adjacent to the chip component; and an interconnect which is formed to extend from above the metal layer, over the insulating section and to above the interconnect pattern.

A method of manufacturing an electronic device according to another aspect of the present invention includes:

mounting a chip component having a pad on a substrate on which an interconnect pattern is formed, in such a manner that a second surface faces the substrate, the pad being formed on a first surface and the second surface being opposite to the first surface;

forming a metal layer on the pad, the metal layer being less oxidizable than the pad;

forming an insulating section adjacent to the chip component; and forming an interconnect in such a manner as to extend from above the metal layer, over the insulating section and to above the interconnect pattern.

A circuit board according to a further aspect of the present invention has the above electronic device mounted thereon.

An electronic instrument according to a still further aspect of the present invention has the above electronic device.

DETAILED DESCRIPTION OF THE EMBODIMENT

Figure 1:
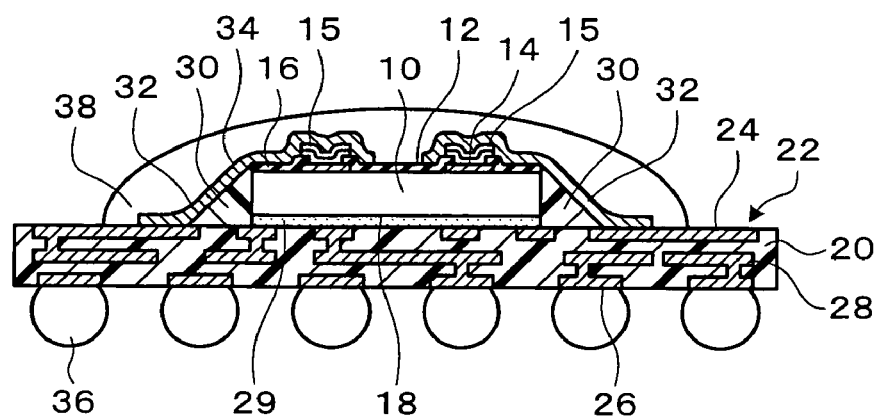
FIG. 1 is a sectional-view taken along the line I-I of FIG. 2.

An embodiment of the present invention may reduce the requirement of thermal resistivity of the substrate, enable a reduction in the generation of stresses in the semiconductor chip, and make it possible to use a general-purpose substrate.

(1) An electronic device according to one embodiment of the present invention includes:

a substrate on which an interconnect pattern is formed;

a chip component having a first surface on which a pad is formed and a second surface opposite to the first surface, the chip component being mounted in such a manner that the second surface faces the substrate;

a metal layer formed on the pad, the metal layer being less oxidizable than the pad;

an insulating section formed adjacent to the chip component; and an interconnect which is formed to extend from above the metal layer, over the insulating section and to above the interconnect pattern.

This embodiment of the present invention makes it possible to create a favorable electrical connection between the pad and the interconnect, because a metal layer that is less oxidizable than the pad is formed over the pad. When the pad and the interconnect pattern are connected electrically, it is possible to avoid high-temperature heating such as that of wire bonding or face-down bonding. This therefore reduces the requirement of thermal resistivity of the substrate, enabling a reduction in the generation of stress in the chip component. Since the interconnect can be formed freely, it is possible to use a general-purpose substrate.

(2) With this electronic device, the insulating section may be formed of resin.

(3) With this electronic device, the insulating section may have an inclined surface descending in an outward direction from the chip component.

(4) A method of manufacturing an electronic device according to another embodiment of the present invention includes:

mounting a chip component having a pad on a substrate on which an interconnect pattern is formed, in such a manner that a second surface faces the substrate, the pad being formed on a first surface and the second surface being opposite to the first surface;

forming a metal layer on the pad, the metal layer being less oxidizable than the pad;

forming an insulating section adjacent to the chip component; and forming an interconnect in such a manner as to extend from above the metal layer, over the insulating section and to above the interconnect pattern.

This embodiment of the present invention makes it possible to create a favorable electrical connection between the pad and the interconnect, because a metal layer which is less oxidizable than the pad is formed over the pad. When the pad and the interconnect pattern are connected electrically, it is possible to avoid high-temperature heating such as that of wire bonding or face-down bonding. This therefore reduces the requirement of thermal resistivity of the substrate, enabling a reduction in the generation of stress in the chip component. Since the interconnect can be formed freely, it is possible to use a general-purpose substrate.

(5) With this method of manufacturing an electronic device, the interconnect may be formed of a dispersant including electrically conductive particles.

(6) With this method of manufacturing an electronic device, the step of forming the interconnect may include ejecting the dispersant including the electrically conductive particles over the metal layer, the insulating section and the interconnect pattern.

(7) With this method of manufacturing an electronic device, the insulating section may be formed of a resin.

(8) With this method of manufacturing an electronic device, the insulating section may be formed to have an inclined surface descending in an outward direction from the chip component.

(9) A circuit board according to a further embodiment of the present invention has the above electronic device mounted thereon.

(10) An electronic instrument according a still further embodiment of the present invention has the above electronic device.

An embodiment of the present invention is described below with reference to the accompanying figures.

Figure 2:
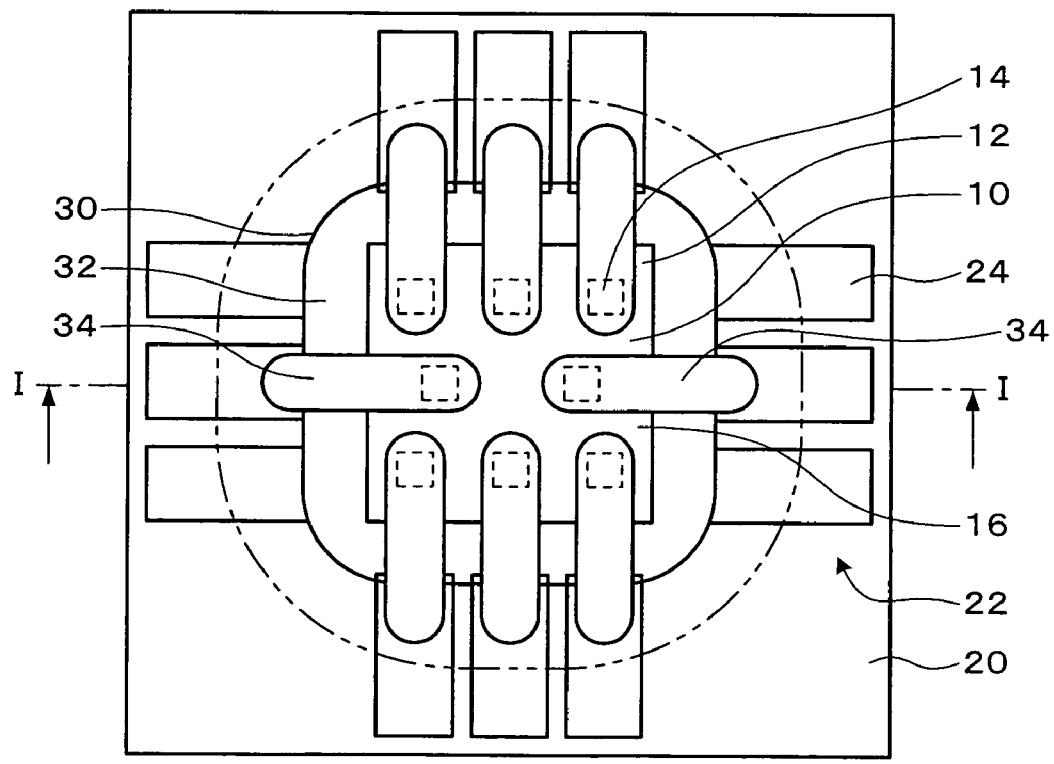
FIG. 2 is a plan view of an electronic device in accordance with an embodiment of the present invention.

An illustrative view of an electronic device in accordance with an embodiment of the present invention is shown in FIG. 1, as a sectional-view taken along the line I-I in FIG. 2. FIG. 2 is a plan view of the electronic device in accordance with this embodiment of the present invention.

The electronic device has a chip component 10. The chip component 10 could be an active component (such as an integrated circuit component) of a semiconductor component (such as a semiconductor chip), by way of example. An integrated circuit (not shown in the figures) could be formed in the chip component 10. If the chip component 10 is a semiconductor chip, the electronic device could be called a semiconductor device. The chip component 10 could also be a passive component (such as a resistor, capacitor, or inductor).

A plurality of pads 14 is formed on a first surface 12 of the chip component 10. The first surface 12 could be a quadrilateral (such as a rectangle). The plurality of pads 14 could be formed along a peripheral portion (edge portion) of the first surface 12. The plurality of pads 14 could be disposed along four edges of the first surface 12, or they could be disposed along two edges. At least one pad 14 could be disposed at a central portion of the first surface 12. The pads 14 could be made of A1, by way of example.

A passivation film 16 including at least one layer could be formed on the first surface 12. The passivation film 16 is an electrically insulating film. The passivation film 16 could be formed solely of a material that is not a resin (such as $SiO_2$ or SiN), or it could further include a film of a resin (such as a polyimide resin) formed thereover. An aperture that exposes at least part of each pad 14 (such as a central portion thereof) is formed in the passivation film 16. In other words, the passivation film 16 is formed to avoid at least the central portion of each pad 14. The passivation film 16 could cover the edge portions of the pad 14. The passivation film 16 could also be formed to cover the entire peripheral portion of the first surface 12.

A metal layer 15 is formed on each pad 14. The metal layer 15 could be formed of one layer, or it could be formed of a plurality of layers. The outer surface of the metal layer 15 could be formed of a material that is less oxidizable than the pad 14 (such as Au). If the metal layer 15 is formed of a plurality of layers, it could have an uppermost layer formed of a material that oxidizes less readily that the pad (such as Au), or it could have a layer in contact with the pad 14. The layer in contact with the pad 14 could be a diffusion prevention layer (a layer that prevents any diffusion of the material formed thereabove into the base material of the 10, such as silicon). Part of the metal layer 15 could be laid over the passivation film 16. The peripheral portions of the metal layer 15 could be positioned further outward than those of the pad 14 or they could be positioned inward thereof. The metal layer 15 could have a central portion that is lower than a peripheral portion thereof. In such a case, a concavity is formed in the metal layer 15. The base of the concavity of the metal layer 15 could be lower than the upper surface of the portion of the passivation film 16 that overlays the passivation film 16 and the pad 14. The metal layer 15 could also be configured so that the a central portion thereof is higher than a peripheral portion thereof. A metal layer 15 could be in the shape of a bump.

Electrodes are not formed on a second surface 18 of the chip component 10 (on the surface opposite to that of the first surface 12). The second surface 18 could be in electrical contact with an integrated circuit (not shown in the figure), or it could be not connected thereto. A passivation film (electrically insulating film) could be formed on the second surface 18 or it could be omitted therefrom. The second surface 18 could be formed of a semiconductor (or conductor). A passivation film (electrically insulating film) could also be formed on the side surfaces of the chip component 10 (the surfaces other than the first and second surfaces 12 and 18) or it could be omitted therefrom. Electrodes are not formed on the side surfaces of the chip component 10. The side surfaces of the chip component 10 could also be formed of a semiconductor (or conductor).

The electronic device has a substrate 20. An interconnect pattern 22 is formed on the substrate 20. The interconnect pattern 22 includes an exposed portion 24 that reveals part of the surface of the substrate 20. An interconnect 34 for providing electrical connections between the chip component 10 and the interconnect pattern 22 is formed on the exposed portion 24. The exposed portion 24 could also have a land (a portion that is wider than a line; not shown in the figures).

The substrate 20 on which the interconnect pattern 22 is formed could be termed a wiring board. A wiring board could be a multi-layer board (including a two-sided board). A multi-layer board includes multiple (two or more) conductor patterns. In this case, the interconnect pattern 22 could also include a second exposed portion 26 that reveals a second surface on the opposite side from the surface that the exposed portion 24 reveals. The interconnect pattern 22 could also include a conductor pattern 28 within the substrate 20. The wiring board could also be a wiring board incorporated in a component. More specifically, passive components such as resistors, capacitors, and inductors or active components such as integrated circuit components could be connected electrically to the conductor pattern 28 within the substrate 20. Alternatively, part of the conductor pattern 28 could be formed into a resistor by forming it of a high-resistance material.

The chip component 10 is mounted on the substrate 20. The second surface 18 of the chip component faces the substrate 20 (specifically, the surface on which the exposed portion 24 is formed). A connecting layer 29 could be interposed between the chip component 10 and the substrate 20. The connecting layer 29 could be formed of an adhesive. The exposed portion 24 and the second surface 18 of the chip component 10 can be connected electrically by making the connecting layer 29 electrically conductive. Alternatively, the exposed portion 24 and the second surface 18 of the chip component 10 can be isolated electrically by making the connecting layer 29 electrically insulating. The connecting layer 29 could be formed of a material that is an electrically insulating dispersant including electrically conductive particles.

The electronic device has an insulating section 30. The insulating section 30 is formed of a material that is electrically insulating (such as a resin). The insulating section 30 could be formed of a material that differs from that of the connecting layer 29. The insulating section 30 is provided adjacent to the chip component 10. The insulating section 30 could be provided so as to surround the chip component 10, or it could be provided only in a region adjacent to each pad 14 of the chip component 10. The insulating section 30 could also be placed in contact with the side surfaces of the chip component 10. In other words, the configuration could be such that there is no space between the insulating section 30 and the chip component 10. In the example shown in FIG. 1, the insulating section 30 is provided in such a fashion that it does not surpass the height of the chip component 10. The upper edge of the insulating section 30 could be at the same height as the upper surface of the chip component 10 (the surface of the passivation film 16). In such a case, there is no step between the insulating section 30 and the chip component 10. The configuration could be such that only portions of the side surfaces of the chip component 10 that are formed of a semiconductor or conductor are covered with the insulating section 30. In such a case, the upper edge of the insulating section 30 is set lower than the upper surface of the passivation film 16.

The insulating section 30 has an inclined surface 32 that descends in the outward direction from the chip component 10. The thickest part of the insulating section 30 is positioned closest to the chip component 10 and the thinnest part thereof is positioned at the farthermost point from the chip component 10. The insulating section 30 could be formed over part of the interconnect pattern 22 (specifically, the exposed portion 24 thereof).

The electronic device has an interconnect 34. Part of the interconnect 34 is formed over each metal layer 15. Since the metal layer 15 oxidizes less readily than the pad 14, a favorable electrical connection can be obtained thereby between the pad 14 and the interconnect 34, rather than forming the interconnect 34 directly on the pad 14. If a peripheral portion of the metal layer 15 overlays the passivation film 16, the surface of the metal layer 15 is broader than the part of the pad 14 that is exposed from the passivation film 16, enabling an even better electrical connection. If the outer surface of the metal layer 15 is indented (or protuberant), this provides more surface area than a flat surface, increasing the electrical connectivity thereof.

The interconnect 34 could also pass over the passivation film 16. The interconnect 34 passes over the insulating section 30. If the insulating section 30 is formed of a resin, the sealing between the insulating section 30 and the interconnect 34 is higher than that between the passivation film 16 and the interconnect 34. It is possible to prevent breakage of the interconnect 34 by minimizing the difference in height between the chip component 10 (such as the passivation film 16 thereof) and the insulating section 30. The interconnect 34 is formed so as to be above the interconnect pattern 22 (specifically, the exposed portion 24 thereof). In other words, the interconnect 34 connects the pad 14 and the interconnect pattern 22 electrically.

The electronic device could be provided with a plurality of external terminals 36. The external terminals 36 could be provided above the interconnect pattern 22 (such as in the second exposed portion 26). The external terminals 36 could be formed of a soldering material. A soldering material is a metal (such as an alloy) which is electrically conductive and which is designed to create an electrical connection on melting. The soldering material could be either a soft solder or a hard solder. A solder that does not include lead (hereinafter called a lead-free solder) could be used as the soldering material. A tin-silver (Sn—Ag), tin-bismuth (Sn—Bi), tin-zinc (Sn—Zn), or tin-copper (Sn—Cu) alloy could be used as the lead-free solder, and at least one of silver, bismuth, zinc, and copper could be added to that alloy.

Known packages that have such external terminals 36 are ball-grid array (BGA) packages and chip-size packages (CSP). Alternatively, another known type of package is a land-grid array (LGA) package that is not provided with the external terminals 36 but part of the interconnect pattern 22 (such as the second exposed section 26) forms an electrical connective portion with the exterior.

The electronic device could also have a sealing member 38. The sealing member 38 seals at least the electrical connective portion between the interconnect 34 and each metal layer 15 and the electrical connective portion between the interconnect 34 and the interconnect pattern 22. The sealing member 38 could also seal in the chip component 10.

Figure 3A:
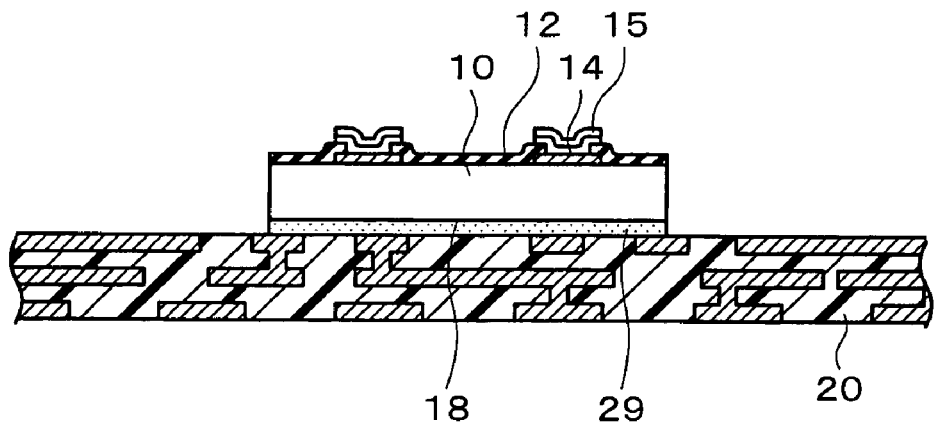
FIGS. 3A to 3C are illustrative of a method of manufacturing an electronic device in accordance with the present invention.
Figure 3B:
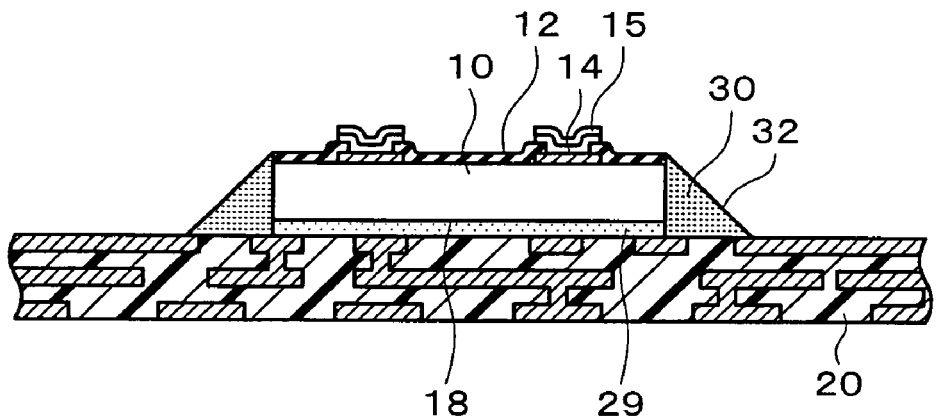
Figure 3C:
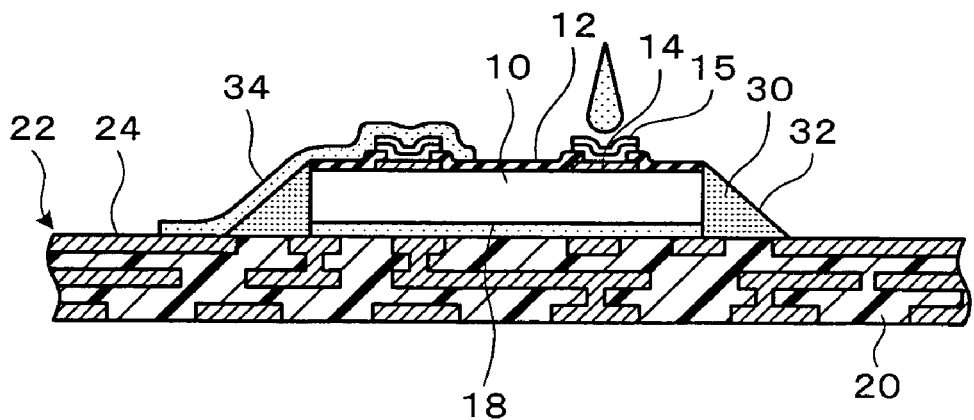

FIGS. 3A to 3C are illustrative of a method of manufacturing an electronic device in accordance with the present invention, with the chip component 10 being mounted on the substrate 20 as shown in FIG. 3A. The metal layer 15 is formed on each pad 14 of the chip component 10. Either electroplating or a non-electrolytic plating method could be used for this formation. At least the outer surface of the metal layer 15 is formed of a material (such as Au) that oxidizes less readily than the material (such as Al) of the pad 14. The metal layer 15 could be formed of a plurality of layers. For example, the configuration could be such that a barrier layer of a metal such as Ni is formed on the pad 14, then a layer of a material that is less oxidizable than the pad 14 is formed thereover. The chip component 10 is mounted so that the second surface 18 thereof faces the substrate 20. An adhesive could be interposed between the substrate 20 and the chip component 10, to form the connecting layer 29. Note that the formation of the metal layer 15 could be done after the chip component 10 has been mounted on the substrate 20.

As shown in FIG. 3B, the insulating section 30 is formed adjacent to the chip component 10. The insulating section 30 could be formed of a material that differs from the adhesive that forms the connecting layer 29. The insulating section 30 could be formed of a resin such as a polyimide resin, a silicone denatured polyimide resin an epoxy resin, a silicone denatured epoxy resin, benzocyclobutene (BCB), or polybenzoxazole (PBO). The insulating section 30 could be formed by potting with a liquid resin, or it could be formed by fixing a dry film. The insulating section 30 is formed to have the inclined surface 32 that descends outward from the chip component 10. The insulating section 30 could also be formed to be in contact with the side surfaces of the chip component 10.

As shown in FIG. 3C, the interconnect 34 is formed. The interconnect 34 is formed so as to extend from above each metal layer 15, passing over the insulating section 30, and to above the interconnect pattern 22 (such as the exposed portion 24 thereof). The interconnect 34 could be formed of a dispersant including electrically conductive particles. An inkjet method could be used therefor, by way of example. More specifically, a dispersant including electrically conductive particles could be ejected over the metal layer 15, the insulating section 30, and the interconnect pattern 22 (such as the exposed portion 24), to form the interconnect 34. The process of forming the interconnect 34 could include the removal of the dispersant medium by drying the dispersant that includes the electrically conductive particles. The process of forming the interconnect 34 could also include the thermal decomposition of a coating material that covers the electrically conductive particles. The process of forming the interconnect 34 could also include a step of polymerizing the electrically conductive particles. The electrically conductive particles could be nanoparticles. In such a case, the volume resistivity of the dispersant can be reduced.

The sealing member 38 could be provided, as shown in FIG. 1. The sealing member 38 could be formed by a transfer mold or by potting. The sealing member 38 could also be omitted.

Since the metal layer 15 of this embodiment oxidizes less readily than the pad 14, a favorable electrical connection can be obtained between the pad 14 and the exposed portion 24, rather than forming the interconnect 34 directly on the pad 14. When the pad 14 and the interconnect pattern 22 are connected electrically, it is possible to avoid using high-temperature heating such as that used during wire bonding or face-down bonding. The requirement that the substrate 20 should have thermal resistivity is therefore reduced, enabling a reduction in the stresses generated in the chip component 10. A general-purpose substrate can be used as the substrate 20, making it possible to route the interconnect 34 to suit the chip component 10 (such as the arrangement of the pads 14 thereof). In such a case, the interconnect 34 can be placed in contact with different portions of the interconnect pattern 22, depending on the type of chip component 10.

FIGS. 4 to 13 show modifications of the electronic device in accordance with further embodiments of the present invention.

Figure 4:
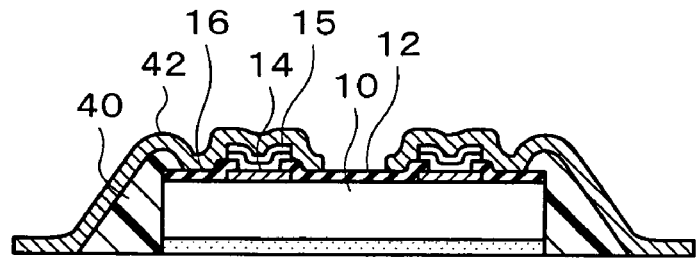
FIG. 4 shows a modification of the electronic device in accordance with an embodiment of the present invention.

In FIG. 4, an insulating section 40 is formed so that part thereof rises up over the first surface 12 of the chip component 10 (specifically, the passivation film 16 thereof). Part of the insulating section 40 overlays a portion closer to the peripheral side of the pad 14 (the metal layer 15) of the chip component 10. To prevent the metal layer 15 being covered by the insulating section 40, the insulating section 40 could be made to stop at a position some distance from the metal layer 15 (at a position nearer the periphery than the pad). Alternatively, the insulating section 40 could be formed adjacent to the metal layer 15. In such a case, the interconnect 42 does not overlay the passivation film 16 that has a low sealing capacity therewith. If the metal layer 15 has a portion that is higher than the passivation film 16 (if a peripheral portion of the metal layer 15 rises higher than the passivation film 16 or if the metal layer 15 is in the shape of a bump), the material for forming the insulating section 40 does not readily overlay the metal layer 15, even if it is a liquid, so that the metal layer 15 can easily be exposed. The insulating section 40 has a portion in contact with the chip component 10 that rises above the first surface 12. The rest of the configuration is the same as that of the electronic device of FIG. 1.

Figure 5:
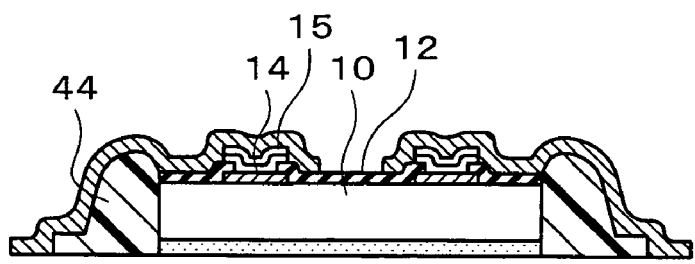
FIG. 5 shows another modification of the electronic device in accordance with an embodiment of the present invention.

In FIG. 5, an insulating section 44 is formed so that part thereof does not overlay the first surface 12 of the chip component 10. The insulating section 44 has a portion in contact with the chip component 10 that rises above the first surface 12. The insulating section 44 has a step-shaped portion on the side opposite to the chip component 10. The rest of the configuration is the same as that of the electronic device of FIG. 1.

Figure 6:
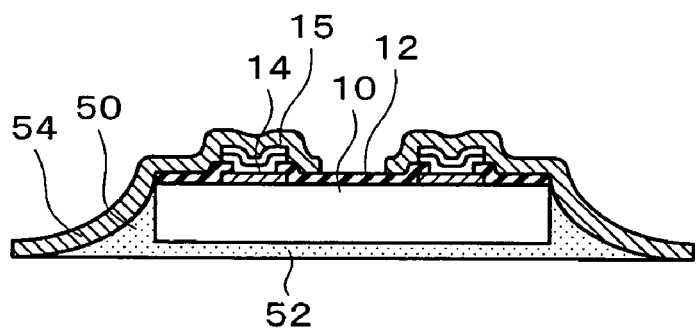
FIG. 6 shows a further modification of the electronic device in accordance with an embodiment of the present invention.

In FIG. 6, an insulating section 50 and a connecting layer 52 are formed integrally. The connecting layer 52 is formed of the same material as the insulating section 50. The insulating section 50 and the connecting layer 52 could be formed from an adhesive by providing an insulating adhesive between the substrate 20 and the chip component 10, then applying a compressive force between the substrate 20 and the chip component 10 so that the adhesive is pressed out to a region adjacent to the chip component 10. An inclined surface 54 of the insulating section 50 is a concave surface (such as a concave surface that draws a curve as seen in a section perpendicular to the first surface 12). The rest of the configuration is the same as that of the electronic device of FIG. 1. The configuration of FIG. 6 can also be used in other embodiments or modifications.

Figure 7:
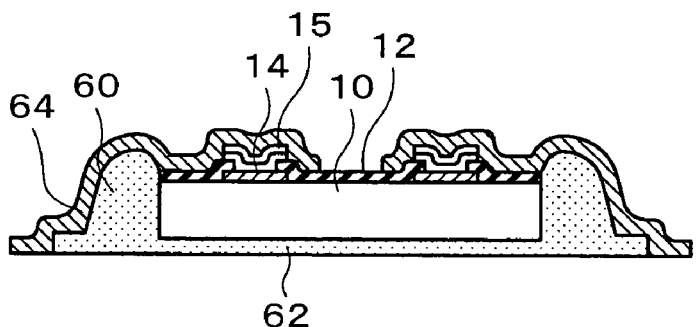
FIG. 7 shows a still further modification of the electronic device in accordance with an embodiment of the present invention.

In FIG. 7, an insulating section 60 and a connecting layer 62 are formed integrally. The connecting layer 62 is formed of the same material as the insulating section 60. The insulating section 60 and the connecting layer 62 could be formed from an adhesive by providing an insulating adhesive between the substrate 20 and the chip component 10, then applying a compressive force between the substrate 20 and the chip component 10 so that the adhesive is pressed out to a region adjacent to the chip component 10. An inclined surface 64 of the insulating section 60 is a convex surface (such as a convex surface that draws a curve as seen in a section perpendicular to the first surface 12). The rest of the configuration is the same as that of the electronic device of FIG. 1. The configuration of FIG. 7 can also be used in other embodiments or modifications.

Figure 8:
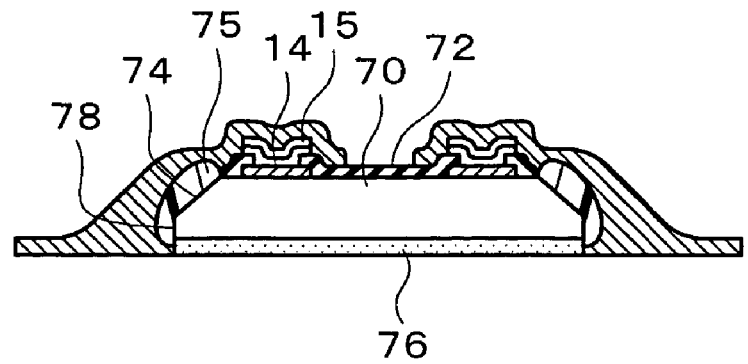
FIG. 8 shows a yet further modification of the electronic device in accordance with an embodiment of the present invention.

In FIG. 8, a chip component 70 has a side surface 74 that is inclined so as to descend in the outward direction from a first surface 72 thereof (a surface on which the pads 14 are formed). Since the side surface 74 is inclined, it is easy to provide an insulating section 75 with an inclined surface thereon. The chip component 70 could also include a side surface 78 that rises perpendicularly from the second surface 76 opposite to the first surface 72. The side surfaces 74 and 78 could also be connected. The rest of the configuration is the same as that of the electronic device of FIG. 1. The configuration of FIG. 8 can also be used in other embodiments or modifications.

Figure 9A:
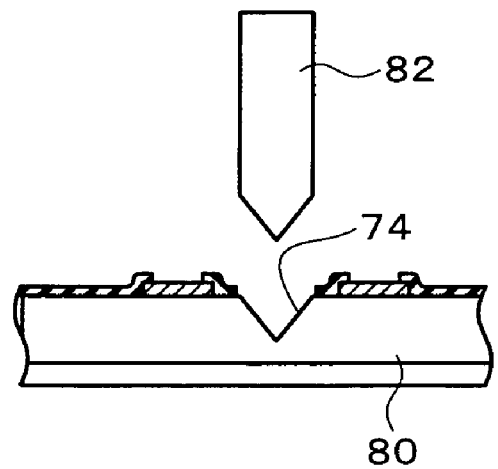
FIGS. 9A and 9B are illustrative of a method of manufacturing a chip component shown in FIG. 8.
Figure 9B:
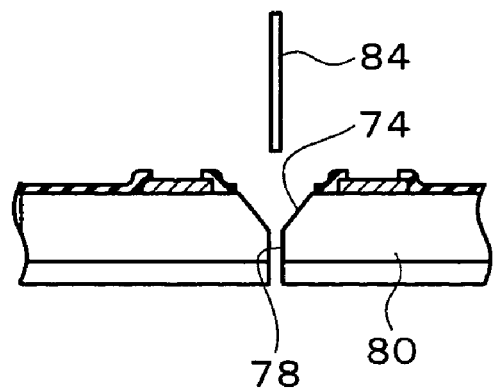

The side surface 74 could be formed when the wafer (such as a semiconductor wafer) 80 is cut apart, as shown in FIG. 9A. More specifically, a cutter (such as a dicing saw) 82 in which two slicing blades are connected at an angle like an angle milling cutter could be used to form a groove (such as a V-shaped groove) having inclined surfaces in the wafer 80, where these inclined surfaces become the side surfaces 74. After the groove has been formed, the base of the groove could be cut by a cutter (such as a dicing saw) 84 having a slicing blade along the external peripheral surfaces. This makes it possible to form the side surface 78 that rises perpendicularly from the second surface 76.

Figure 10:
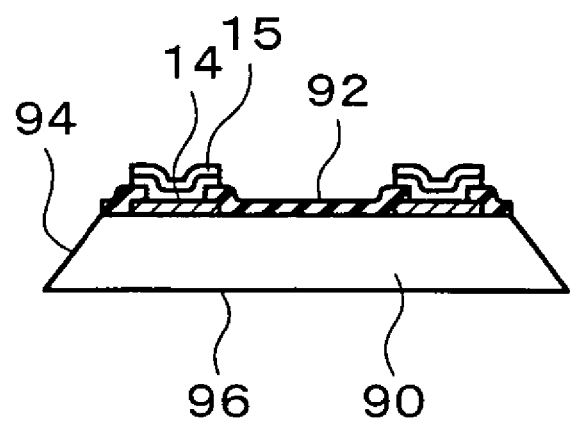
FIG. 10 shows a modification of the electronic device in accordance with an embodiment of the present invention.

In FIG. 10, a side surface 94 of a chip component 90 is inclined so as to descend in the outward direction from a first surface (a surface on which the pads 14 are formed) 92. The side surface 94 is also inclined with respect to a second surface 96 on the opposite side from the first surface 92. The rest of the configuration is the same as that of the electronic device of FIG. 1. The configuration of FIG. 10 can also be used in other embodiments or modifications.

Figure 11:
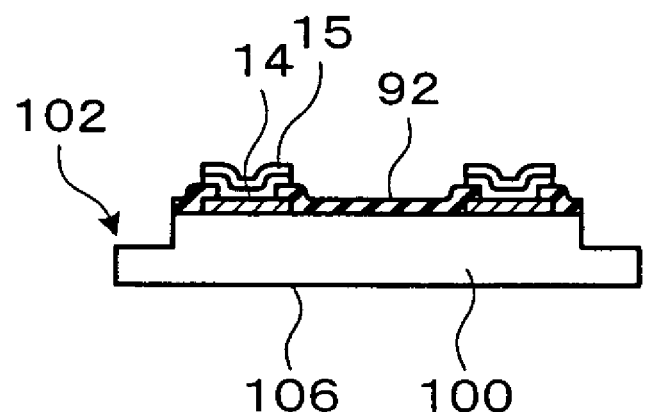
FIG. 11 shows another modification of the electronic device in accordance with an embodiment of the present invention.

In FIG. 11, an edge portion of a chip component 100 has a step 102. The step 102 includes a surface that descends (such as perpendicularly) from a first surface (a surface on which the pads 14 are formed) 104, a surface that rises (such as perpendicularly) from a second surface 106 opposite to the first surface 104, and a surface that extends in the lateral direction (such as parallel to either the first or second surface 104 or 106) to connect the other two surfaces. The rest of the configuration is the same as that of the electronic device of FIG. 1. The configuration of FIG. 11 can also be used in other embodiments or modifications.

Figure 12:
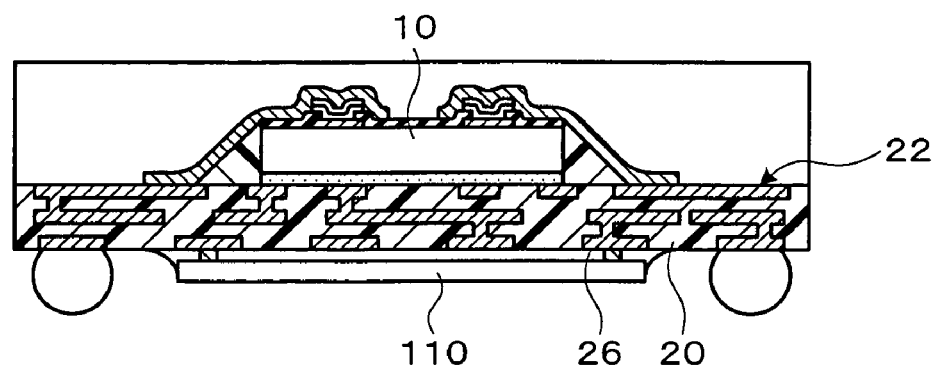
FIG. 12 shows a further modification of the electronic device in accordance with an embodiment of the present invention.

In FIG. 12, a second chip component 110 is mounted on a surface of the substrate 20 on the opposite side from the surface on which the chip component 10 is mounted. The second chip component 110 is connected electrically to the interconnect pattern 22 (specifically, the second exposed portion 26). The mounting state of the second chip component 110 could be either face-down bonding or face-up bonding. With face-down bonding, the electrodes (bumps) of the second chip component 110 face the interconnect pattern 22 and are electrically connected thereto. With face-up bonding, wires could be used to form the electrical connections. The rest of the configuration is the same as that of the electronic device of FIG. 1. The configuration of FIG. 12 can also be used in other embodiments or modifications.

Figure 13:
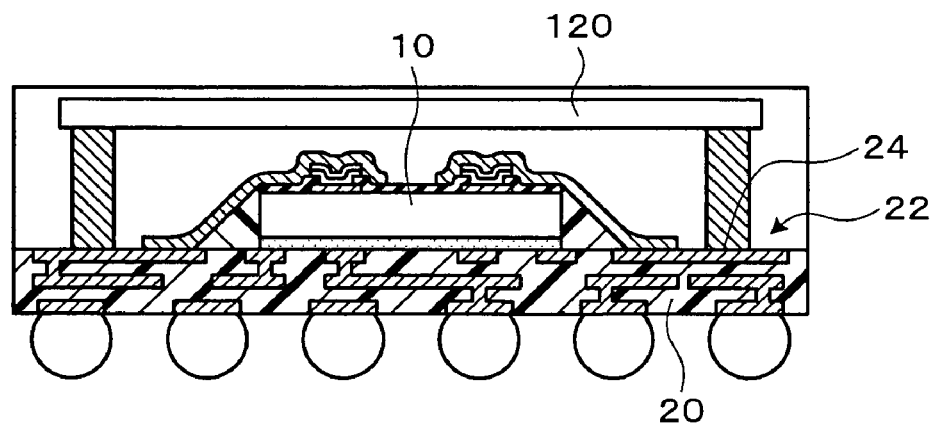
FIG. 13 shows a still further modification of the electronic device in accordance with an embodiment of the present invention.

In FIG. 13, a second chip component 120 is mounted on a surface of the substrate 20 on which the chip component 10 is mounted. The second chip component 120 could be disposed higher than the chip component 10 (or to cover the chip component 10), by way of example. The second chip component 120 is connected electrically to the interconnect pattern 22 (specifically, the exposed portion 24). The mounting state of the second chip component 120 could be either face-down bonding or face-up bonding. With face-down bonding, the electrodes (bumps) of the second chip component 120 face the interconnect pattern 22 and are electrically connected thereto. With face-up bonding, wires could be used to form the electrical connections. The rest of the configuration is the same as that of the electronic device of FIG. 1. The configuration of FIG. 13 can also be used in other embodiments or modifications.

Figure 14:
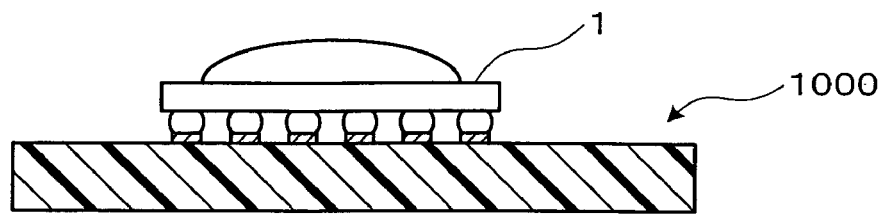
FIG. 14 shows a circuit board on which is mounted an electronic device in accordance with this embodiment.
Figure 15:
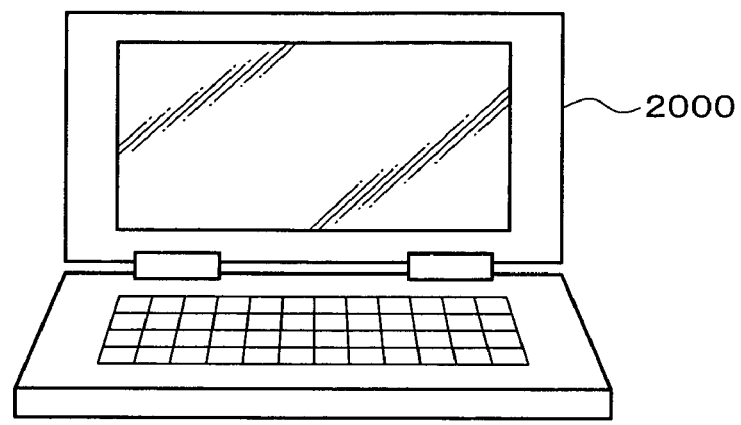
FIG. 15 shows an electronic instrument having an electronic device in accordance with this embodiment.
Figure 16:
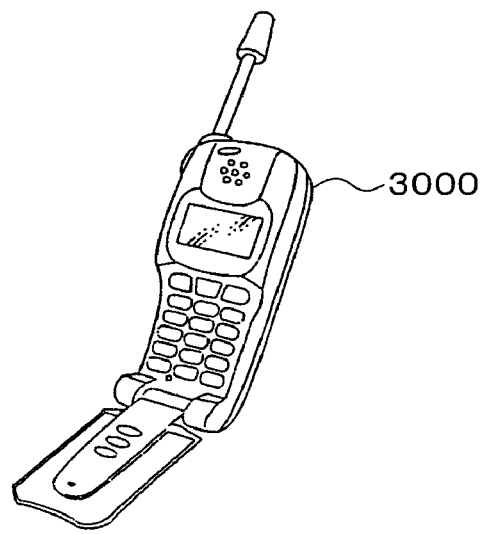
FIG. 16 shows another electronic instrument having an electronic device in accordance with this embodiment.

A circuit board 1000 on which is mounted an electronic device 1 as defined by any of the above-described embodiments is shown in FIG. 14. A notebook-type personal computer 2000 shown in FIG. 15 and a mobile phone 3000 shown in FIG. 16 are examples of electronic instruments having this electronic device.

The present invention is not limited to the above-described embodiments and thus various modifications thereto are possible. For example, the present invention also includes configurations that are substantially the same as the configurations described with reference to the embodiments herein (such as embodiments that have the same function, method, and effect or embodiments that have the same objective and effect). The present invention also includes the substitution of components that mentioned in a non-essential part of the description of the embodiments herein. Furthermore, the present invention also includes configurations that can achieve the same operating effect or the same objective as the embodiments described herein. The present invention further includes configurations wherein known techniques are added to the embodiments described herein.

What is claimed is:

1. A method of manufacturing an electronic device, the method comprising:
   preparing a chip component and a substrate, the chip component having a base material, the chip component having a first surface on which a pad is formed and a passivation film is formed to avoid at least a part of the pad, the chip component having a second surface being opposite to the first surface, the substrate having an interconnect pattern;
   providing an insulating adhesive on the substrate;
   mounting the chip component on the insulating adhesive in such a manner that the second surface faces the insulating adhesive with applying a compressive force between the substrate and the chip component so that the insulating adhesive has a first part and a second part, the first part being interposed between the chip component and the substrate, the second part being disposed adjacent to the chip component, the second part having a convex surface that draws a curve on a view from which a cross section perpendicular to the first surface of the chip component is taken, the convex surface ascending from the first surface to have a top surface and descending from the top surface in an outward direction;
   forming a metal layer that includes a plurality of layers including a diffusion prevention layer in contact with the pad and an uppermost layer being less oxidizable than the pad, the diffusion prevention layer preventing any diffusion of material formed thereabove into the base material of the chip component; and
   forming an interconnect in such a manner as to extend from above the uppermost layer of the metal layer to above the interconnect pattern, as to have a first section disposed on the passivation film and a second section disposed over the insulating section, and as to cover all the lateral surfaces of the metal layer.

2. The method of manufacturing an electronic device as defined by claim 1,
wherein the interconnect is formed of a dispersant including electrically conductive particles.

3. The method of manufacturing an electronic device as defined by claim 2,
wherein the step of forming the interconnect includes ejecting the dispersant including the electrically conductive particles over the metal layer, the insulating section and the interconnect pattern.

4. The method of manufacturing an electronic device as defined by claim 1,
wherein the insulating section is formed of a resin.

5. The method of manufacturing an electronic device as defined by claim 2,
wherein the insulating section is formed of a resin.

6. The method of manufacturing an electronic device as defined by claim 3,
wherein the insulating section is formed of a resin.

* * * * *